(12) United States Patent
Chen et al.

(10) Patent No.: US 10,361,342 B2
(45) Date of Patent: Jul. 23, 2019

(54) LIGHT-EMITTING DEVICE

(71) Applicant: EPISTAR CORPORATION, Hsinchu (TW)

(72) Inventors: Chao-Hsing Chen, Hsinchu (TW);
Jia-Kuen Wang, Hsinchu (TW);
Wen-Hung Chuang, Hsinchu (TW);
Tzu-Yao Tseng, Hsinchu (TW);
Cheng-Lin Lu, Hsinchu (TW);
Chi-Shiang Hsu, Hsinchu (TW);
Tsung-Hsun Chiang, Hsinchu (TW);
Bo-Jiun Hu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/633,264

(22) Filed: Jun. 26, 2017

(65) Prior Publication Data

US 2017/0373226 A1    Dec. 28, 2017

(30) Foreign Application Priority Data

Jun. 28, 2016    (TW) .............................. 105120263 A

(51) Int. Cl.
| | |
|---|---|
| *H01L 33/62* | (2010.01) |
| *H01L 33/38* | (2010.01) |
| *F21V 29/77* | (2015.01) |
| *F21K 9/232* | (2016.01) |
| *F21K 9/237* | (2016.01) |
| *F21V 3/02* | (2006.01) |
| *F21V 5/04* | (2006.01) |
| *F21V 23/06* | (2006.01) |

(Continued)

(52) U.S. Cl.
CPC ............ *H01L 33/387* (2013.01); *F21K 9/232* (2016.08); *F21K 9/237* (2016.08); *F21V 3/02* (2013.01); *F21V 5/04* (2013.01); *F21V 23/06* (2013.01); *F21V 29/77* (2015.01); *H01L 33/382* (2013.01); *H01L 33/405* (2013.01); *H01L 33/44* (2013.01); *F21Y 2115/10* (2016.08); *H01L 33/20* (2013.01); *H01L 33/42* (2013.01); *H01L 33/62* (2013.01); *H01L 2224/16245* (2013.01); *H01L 2933/0016* (2013.01); *H01L 2933/0025* (2013.01); *H01L 2933/0066* (2013.01)

(58) Field of Classification Search
None
See application file for complete search history.

(56) References Cited

U.S. PATENT DOCUMENTS 5,984,511 A  *  11/1999  Vasey-Glandon ...... G06F 17/50
345/420
8,655,627 B2 *   2/2014  Grape .................. G06F 17/5095
700/98

(Continued)

*Primary Examiner* — Ali Naraghi
(74) *Attorney, Agent, or Firm* — Patterson + Sheridan, LLP

(57) ABSTRACT

A light-emitting device comprises a semiconductor stack comprising a first semiconductor layer, a second semiconductor layer, and an active layer formed between the first semiconductor layer and the second semiconductor layer; a first pad electrically connected to the first semiconductor layer; a second pad comprising multiple sidewalls electrically connected to the second semiconductor layer; and a metal layer formed on the semiconductor stack, wherein the metal layer surrounds the multiple sidewalls of the second pad and the metal layer is separated from the second pad.

19 Claims, 14 Drawing Sheets

(51) Int. Cl.
    *H01L 33/40*     (2010.01)
    *H01L 33/44*     (2010.01)
    *F21Y 115/10*     (2016.01)
    *H01L 33/42*     (2010.01)
    *H01L 33/20*     (2010.01)

(56) References Cited

U.S. PATENT DOCUMENTS

| | | | |
|---|---|---|---|
| 2011/0220937 A1* | 9/2011 | Jeong | H01L 33/22 |
| | | | 257/98 |
| 2013/0234192 A1* | 9/2013 | Kim | H01L 33/0008 |
| | | | 257/98 |
| 2013/0309438 A1* | 11/2013 | O'Reilly | A63C 17/01 |
| | | | 428/80 |
| 2014/0131758 A1* | 5/2014 | Shinohara | H01L 33/382 |
| | | | 257/99 |
| 2016/0179984 A1* | 6/2016 | Chen-Keat | G06T 17/00 |
| | | | 703/1 |
| 2016/0181477 A1* | 6/2016 | Lee | H01L 33/40 |
| | | | 257/98 |
| 2016/0240759 A1* | 8/2016 | Chae | H01L 33/36 |

\* cited by examiner

US 10,361,342 B2

LIGHT-EMITTING DEVICE

REFERENCE TO RELATED APPLICATION

This application claims the right of priority based on TW Application Serial No. 105120263, filed on Jun. 28, 2016 and the content of which is hereby incorporated by reference in its entirety.

TECHNICAL FIELD

The application relates to a structure of a light-emitting device, and more particularly, to a light-emitting device comprising a semiconductor stack and a pad on the semiconductor stack.

DESCRIPTION OF BACKGROUND ART

Light-Emitting Diode (LED) is a solid-state semiconductor light-emitting device, which has the advantages of low power consumption, low heat generation, long working lifetime, shockproof, small volume, fast reaction speed and good optoelectronic property, such as stable emission wavelength. Therefore, light-emitting diodes are widely used in household appliances, equipment indicators, and optoelectronic products.

SUMMARY OF THE APPLICATION

A light-emitting device comprises a semiconductor stack comprising a first semiconductor layer, a second semiconductor layer, and an active layer formed between the first semiconductor layer and the second semiconductor layer; a first pad electrically connected to the first semiconductor layer; a second pad comprising multiple sidewalls electrically connected to the second semiconductor layer; and a metal layer formed on the semiconductor stack, wherein the metal layer surrounds the multiple sidewalls of the second pad and the metal layer is separated from the second pad.

A light-emitting device comprises a semiconductor stack comprising a first semiconductor layer, a second semiconductor layer, and an active layer formed between the first semiconductor layer and the second semiconductor layer; a first contact layer on the semiconductor stack; a first pad comprising a side on the first contact layer; a second pad formed on the semiconductor stack; and an insulating layer comprising a first portion covered by the first pad and a connecting portion adjacent to the side of the first pad, wherein the insulating layer comprises an opening between the first portion and the connecting portion to expose the first contact layer, the opening is constituted by a first side of the first portion and a side of the connecting portion, a distance between the side of the first pad and the first side of the first portion is smaller than 100 μm, or a distance between the side of the first pad and the side of the connecting portion is smaller than 100 μm.

DETAILED DESCRIPTION OF PREFERRED EMBODIMENTS

Figure 1:
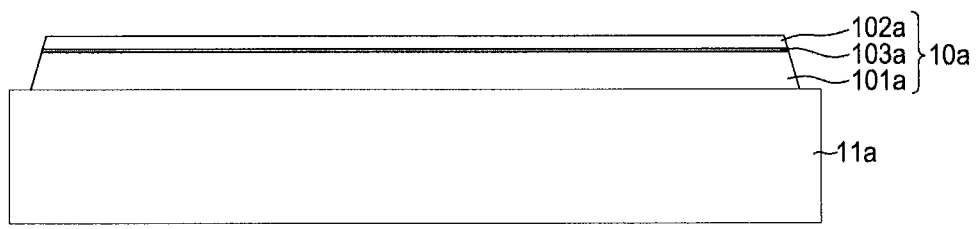
FIGS. 1-9B illustrate a manufacturing method of a light-emitting device 1 and a structure of the light-emitting device 1 in accordance with an embodiment of the present application.

The embodiment of the application is illustrated in detail, and is plotted in the drawings. The same or the similar part is illustrated in the drawings and the specification with the same number.

FIGS. 1-9B illustrate a manufacturing method and a structure of a light-emitting device 1 in accordance with an embodiment of the present application.

As FIG. 1 shows, the manufacturing method of the light-emitting device 1 comprises a step of forming a semiconductor stack 10a, which includes providing a substrate 11a and forming the semiconductor stack 10a on the substrate 11a, wherein the semiconductor stack 10a comprises a first semiconductor layer 101a, a second semiconductor layer 102a, and an active layer 103a between the first semiconductor layer 101a and the second semiconductor layer 102a.

In an embodiment of the present application, the substrate 11a is a growth substrate comprising gallium arsenide (GaAs) wafer for growing aluminum gallium indium phosphide (AlGaInP), sapphire ($Al_2O_3$) wafer, gallium nitride (GaN) wafer or silicon carbide (SiC) wafer for growing indium gallium nitride (InGaN).

In an embodiment of the present application, the light-emitting device 1 comprises optical characteristics, such as light-emitting angle or wavelength distribution, and electrical characteristics, such as forward voltage or reverse current. The semiconductor stack 10a can be formed on the substrate 11a by organic metal chemical vapor deposition (MOCVD), molecular beam epitaxy (MBE), hydride vapor deposition (HVPE), physical vapor deposition (PVD) or ion plating, wherein the physical vapor deposition (PVD) comprises sputtering or evaporation. The first semiconductor layer 101a and the second semiconductor layer 102a, such as a cladding layer, have different conductivity types, electrical properties, polarities, or doping elements for providing electrons or holes. For example, the first semiconductor layer 101a is an n-type semiconductor, and the second semiconductor layer 102a is a p-type semiconductor. The active layer 103a is formed between the first semiconductor layer 101a and the second semiconductor layer 102a. The electrons and holes combine in the active layer 103a driven by a current to convert electric energy into light energy to emit a light. The wavelength of the light emitted from the light-emitting device 1 is adjusted by changing the physical and chemical composition of one or more layers in the semiconductor stack 10a. The material of the semiconductor stack 10a comprises a group III-V semiconductor material, such as $Al_xIn_yGa_{(1-x-y)}N$ or $Al_xIn_yGa_{(1-x-y)}P$, wherein $0 \le x$, $y \le 1$; $(x+y) \le 1$. According to the material of the active layer 103a, when the material of the semiconductor stack 10a is AlInGaP material, red light having a wavelength between 610 nm and 650 nm or yellow light having a wavelength between 550 nm and 570 nm can be emitted. When the material of the semiconductor stack 10a comprises GaN, InGaN or AlGaN material, blue light having a wavelength between 450 nm and 490 nm or green light having a wavelength between 490 nm and 550 nm can be emitted. When the material of the semiconductor stack 10a comprises AlGaN or AlGaInN material, UV light having a wavelength between 400 nm and 250 nm can be emitted. The active layer 103a can be a single heterostructure (SH), a double heterostructure (DH), a double-side double heterostructure (DDH), a multi-quantum well structure, MQW). The material of the active layer 103a can be i-type, p-type, or n-type semiconductor.

In an embodiment of the present application, a buffer layer of PVD aluminum nitride (AlN) can be formed between the semiconductor stack 10a and the substrate 11a to improve the epitaxy quality of the semiconductor stack 10a. In the embodiment, a target used to form PVD aluminum nitride (AlN) is composed of aluminum nitride. In another embodiment, a target made of aluminum is used to form aluminum nitride in the environment of a nitrogen source.

Figure 2A:
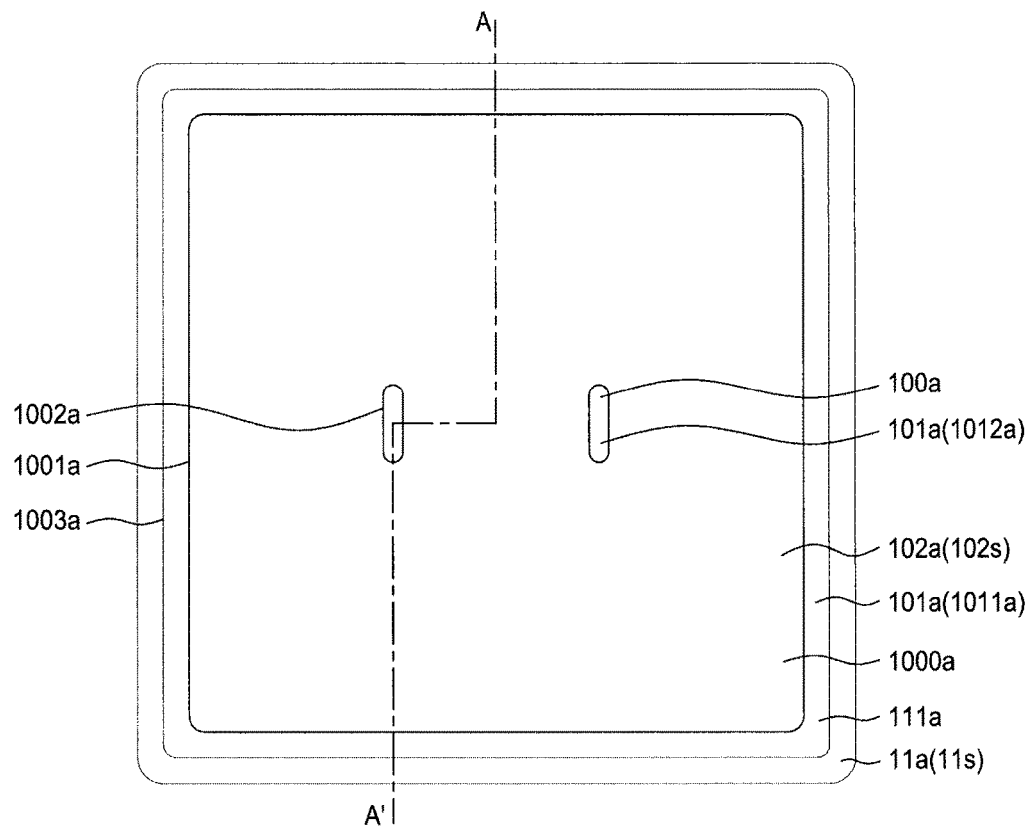
Figure 2B:
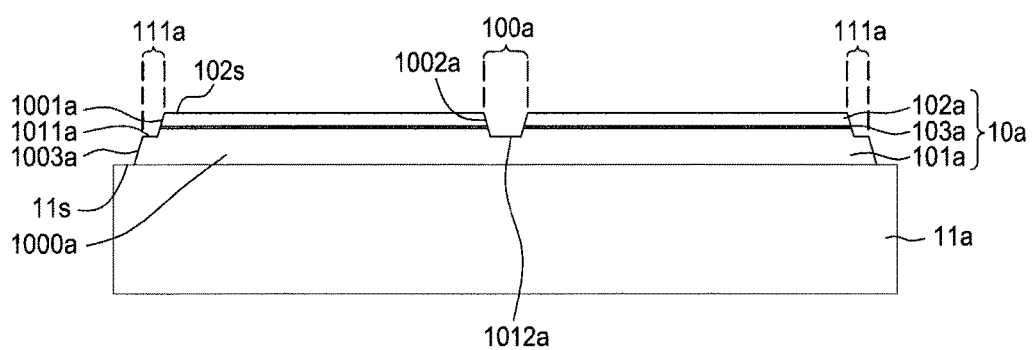

As a top view in FIG. 2A and a cross-sectional view in FIG. 2B which is taken along line A-A' of FIG. 2A show, after the semiconductor stack 10a is formed on the substrate 11a, the manufacturing method of the light-emitting device 1 comprises a step of forming a mesa. The semiconductor stack 10a is patterned by lithography and etching to remove a portion of the second semiconductor layer 102a and the active layer 103a to form one or multiple semiconductor structures 1000a and a surrounding part 111a surrounding the one or multiple semiconductor structures 1000a, which expose a first surface 1011a and form one or multiple vias 100a exposing a second surface 1012a of the first semiconductor layer 101a.

In an embodiment of the present application, the multiple semiconductor structures 1000a are separated from each other to expose a surface 11s of the substrate 11a or connected to each other through the first semiconductor layer 101a. The one or multiple semiconductor structures 1000a respectively comprises a first outside wall 1003a, a second outside wall 1001a, and one or more inside walls 1002a, wherein the first outside wall 1003a is a sidewall of the first semiconductor layer 101a, the second outside wall 1001a is a sidewall of the active layer 103a and/or a sidewall of the second semiconductor layer 102a. One end of the second outside wall 1001a is connected to a surface 102s of the second semiconductor layer 102a and another end of the second outside wall 1001a is connected to the first surface 1011a of the first semiconductor layer 101a. One end of the inside wall 1002a is connected to the surface 102s of the second semiconductor layer 102a and another end of the inside wall 1002a is connected to the second surface 1012a of the first semiconductor layer 101a. As FIG. 2B shows, an obtuse angle or a right angle is formed between the inside wall 1002a of the semiconductor structure 1000a and the second surface 1012a of the first semiconductor layer 101a. An obtuse angle or a right angle is formed between the first outside wall 1003a of the semiconductor structure 1000a and a surface 11s of the substrate 11a. An obtuse angle or a right angle is formed between the second outside wall 1001a of the semiconductor structure 1000a and the first surface 1011a of the first semiconductor layer 101a.

In an embodiment of the present application, as FIG. 2A shows, the top view of the surrounding part 111a is a rectangular or a polygonal shape.

In an embodiment of the present application, the via 100a comprises an opening having a shape, such as circular, ellipsoidal, rectangular, polygonal, or any shape. The multiple vias 100a can be arranged in a plurality of rows, and the vias 100a in any or each of the adjacent two rows can be aligned with each other or staggered.

In an embodiment of the present application, the multiple vias 100a can be arranged in a first row and a second row. A first shortest distance is between two adjacent vias 100a in the same row. A second shortest distance is between the via 100a located in the first row and the via 100a in the second row. The first shortest distance is greater than or smaller than the second shortest distance. The light field distribution of the light-emitting device 1 can be made uniform and the forward voltage of the light-emitting device 1 can be reduced by dispersedly disposing the multiple vias 100a when an external current is injected into the light-emitting device 1.

In an embodiment of the present application, the multiple vias 100a can be arranged in a first row, a second row and a third row. A second shortest distance is between the via 100a in the first row and the via 100a in the second row, and a third shortest distance is between the via 100a in the second row and the via 100a in the third row, wherein the first shortest distance is smaller than the second shortest distance. The light field distribution of the light-emitting device 1 can be made uniform and the forward voltage of the light-emitting device 1 can be reduced by dispersedly disposing the multiple vias 100a when an external current is injected into the light-emitting device 1.

In an embodiment of the present application, the light-emitting device 1 comprises a side larger than 30 mil, the light-emitting device 1 comprises a surrounding part 111a and one or multiple vias 100a. A first shortest distance is between two adjacent vias 100a, and a fourth shortest distance is between any of the vias 100a and the first outside wall 1003a of the first semiconductor layer 101a, wherein the first shortest distance is smaller than the second shortest distance. When an external current is injected into the light-emitting device 1, the surrounding part 111a is disposed to surround the multiple vias and the multiple vias 100a are dispersedly disposed to uniform the light field distribution of the light-emitting device 1 and reduce the forward voltage of the light-emitting device 1.

In an embodiment of the present application, the light-emitting device 1 comprises a side less than 30 mil, the light-emitting device 1 comprises a surrounding part 111a, but does not comprise the via 100a to increase the light-emitting area of the active layer. When an external current is injected into the light-emitting device 1, the surrounding part 111a surrounds the semiconductor structure 1000a to uniform the light field distribution of the light-emitting device 1 and reduce the forward voltage of the light-emitting device 1.

Figure 3A:
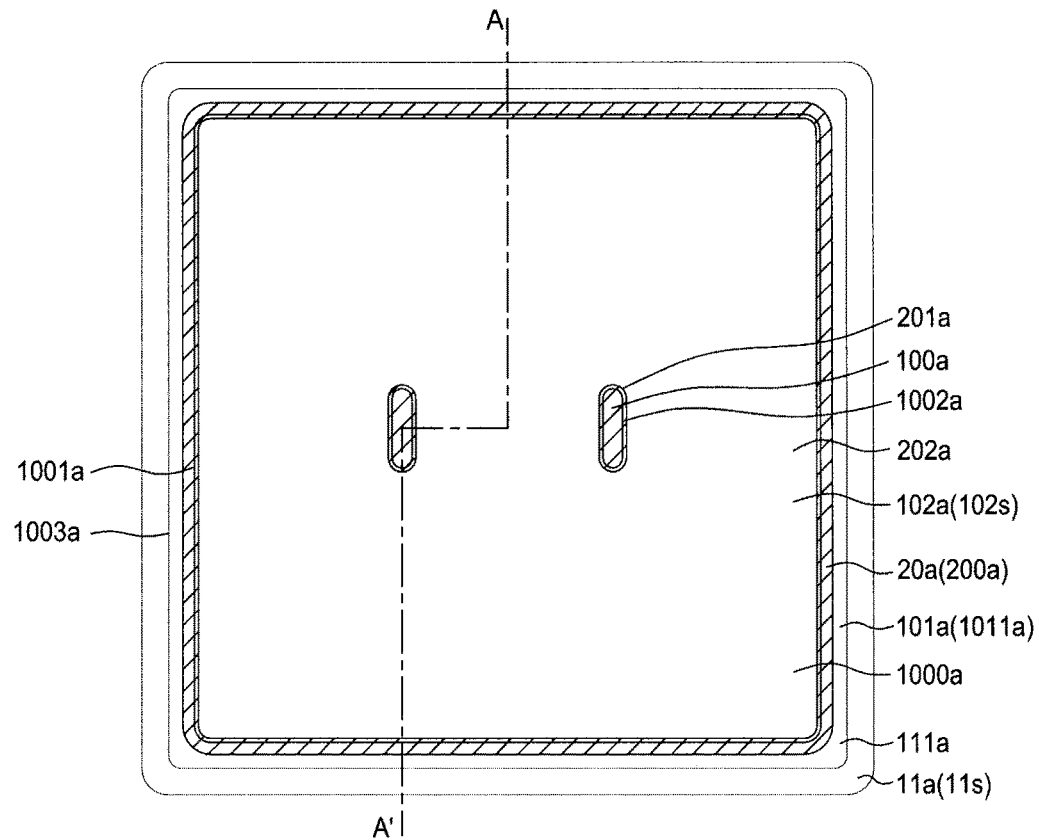
Figure 3B:
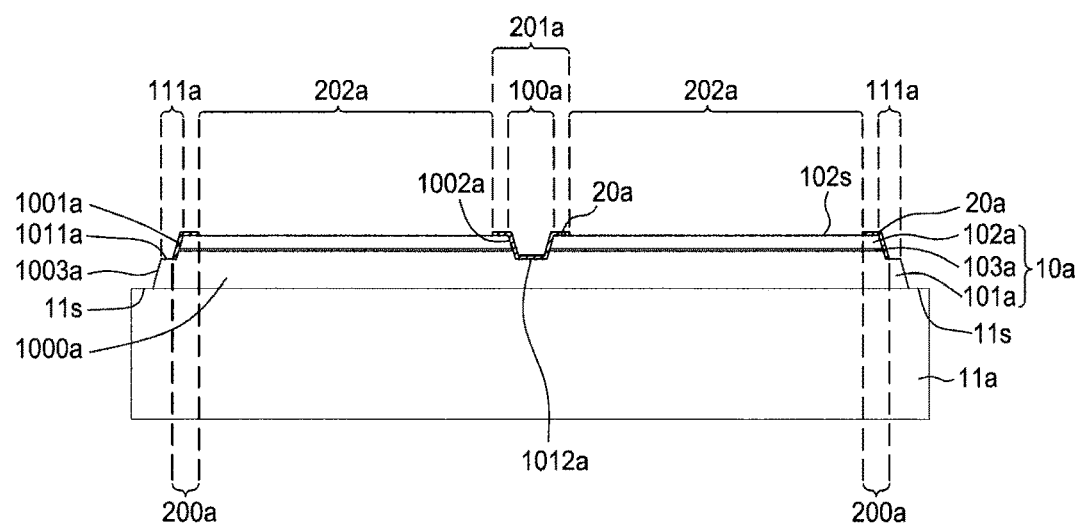

Following the step of forming the mesa, as a top view in FIG. 3A and a cross-sectional view in FIG. 3B which is taken along line A-A' of FIG. 3A show, the manufacturing method of the light-emitting device 1 comprises a step of forming a first insulating layer. A first insulating layer 20a is formed on the semiconductor structure 1000a by physical vapor deposition or chemical vapor deposition. The first insulating layer 20a is patterned by lithography and etching to form a first insulating surrounding region 200a covering part of the first surface 1011a of the surrounding part 111a and the second outside wall 1001a of the semiconductor structure 1000a, a group of first insulating covering regions 201a covering the second surface 1012a of the vias 100a and the inside wall 1002a of the semiconductor structure 1000a, and the first insulating opening 202a exposing the surface 102s of the second semiconductor layer 102a. The group of first insulating covering regions 201a is separated from each other and respectively corresponding to the multiple vias 100a. The first insulating layer 20a can include only one layer. When the first insulating layer 20a includes only one layer, the first insulating layer 20a protects the sidewall of the semiconductor structure 1000a and prevents the active layer 103a from being destroyed by subsequent processes. When multiple first insulating layers 20a are formed on the semiconductor structure 1000a the multiple first insulating layers 20a include two or more materials having different refractive indexes alternately stacked to form a Distributed Bragg reflector (DBR), which can selectively reflect light of a specific wavelength, in addition to protect the semiconductor structure 1000a. The one or the multiple first insulating layers 20a are formed of a non-conductive material and comprises organic material, such as Sub, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, fluorocarbon polymer, or inorganic material, such as silicone, glass, or dielectric material, such as aluminium oxide ($Al_2O_3$), silicon nitride ($SiN_x$), silicon oxide ($SiO_x$), titanium oxide ($TiO_x$), or magnesium fluoride ($MgF_x$).

Figure 4A:
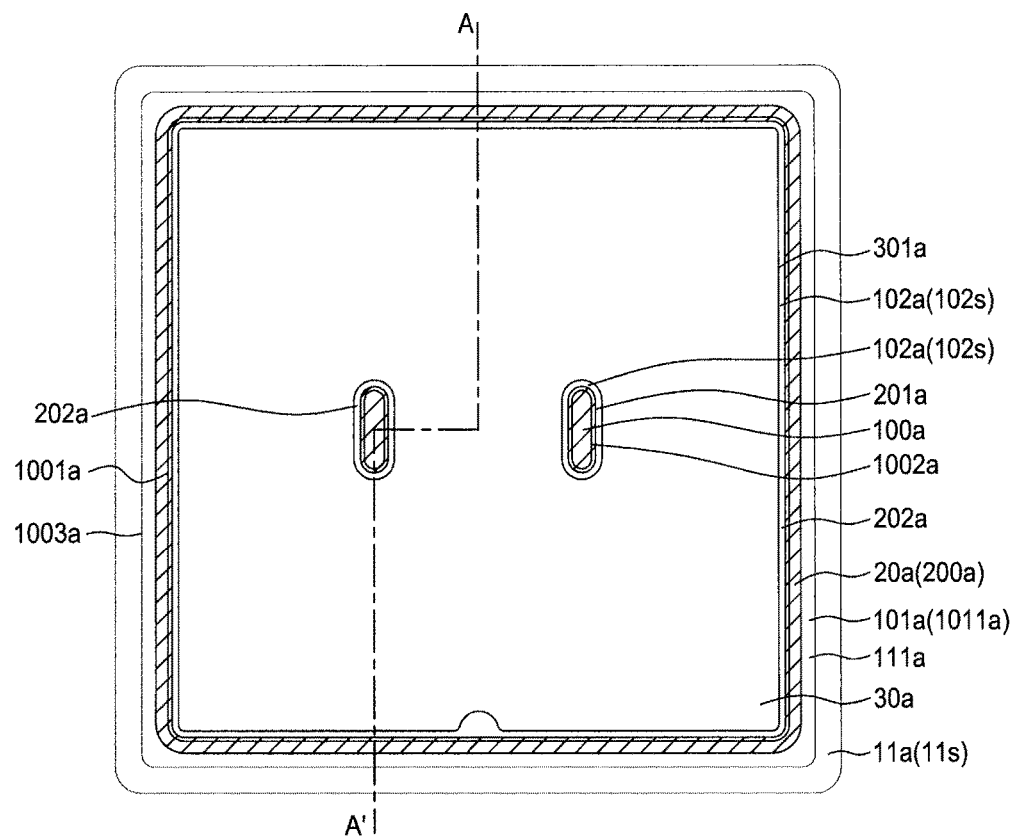
Figure 4B:
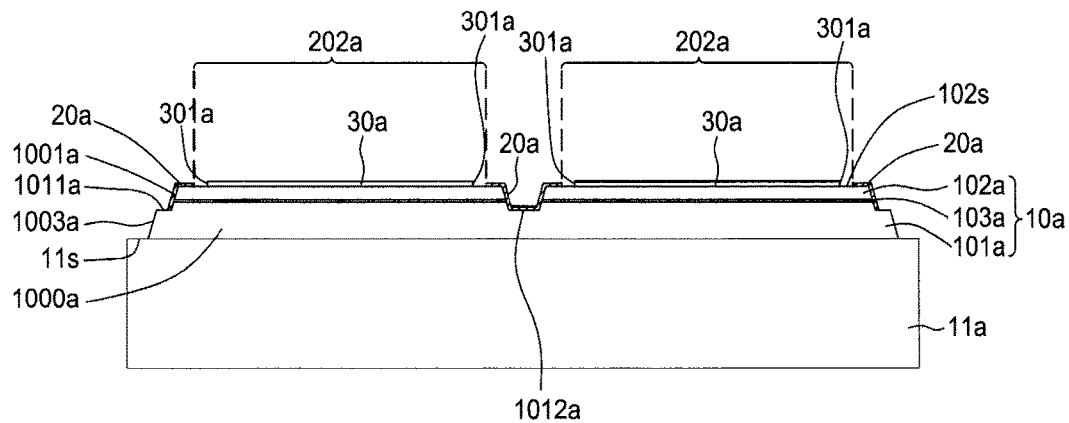

In an embodiment of the present application, following the step of forming the first insulating layer, as a top view in FIG. 4A and a cross-sectional view in FIG. 4B which is taken along line A-A' of FIG. 4A show, the manufacturing method of the light-emitting device 1 comprises a step of forming a transparent conductive layer. A transparent conductive layer 30a can be formed in the first insulating opening 202a by physical vapor deposition or chemical vapor deposition, wherein an outer edge 301a of the transparent conductive layer 30a is spaced apart from the first insulating layer 20a with a distance to expose the partial surface 102s of the second semiconductor layer 102a. Because the transparent conductive layer 30a is substantially formed on the entire surface of the second semiconductor layer 102a and contacts the second semiconductor layer 102a, the electrical current is uniformly spread in the entirety of the second semiconductor layer 102a. The material of the transparent conductive layer 30a comprises a material transparent to the light emitted from the active layer 103a, such as indium tin oxide (ITO) or indium zinc oxide (IZO).

In another embodiment of the present application, after the step of forming the mesa, the step of forming the transparent conductive layer can be performed first and is followed by the first insulating layer forming step.

In another embodiment of the present application, after the step of forming the mesa, the step of forming the first insulating layer can be omitted and the step of forming the transparent conductive layer is directly performed.

Figure 5A:
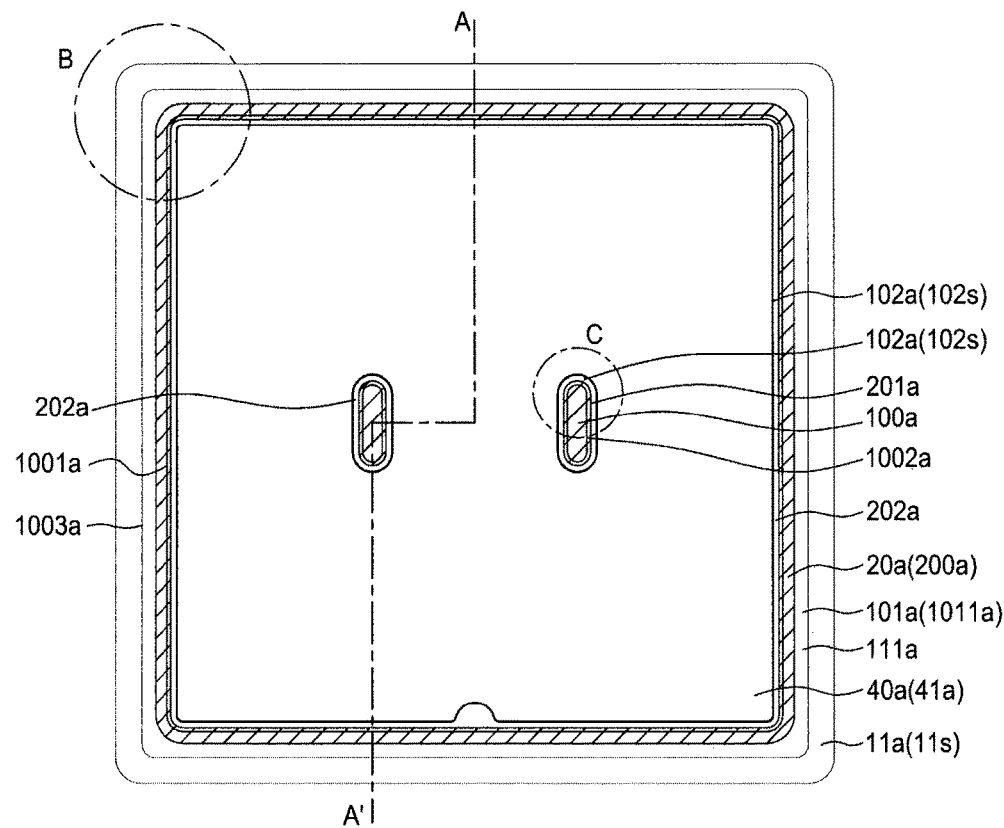
Figure 5B:
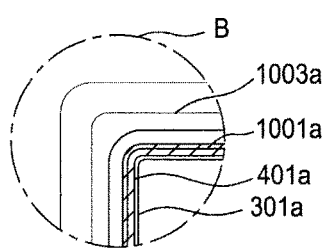
Figure 5C:
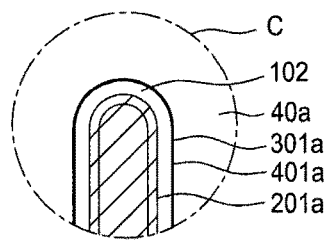
Figure 5E:
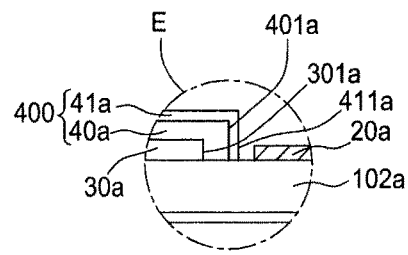
Figure 5D:
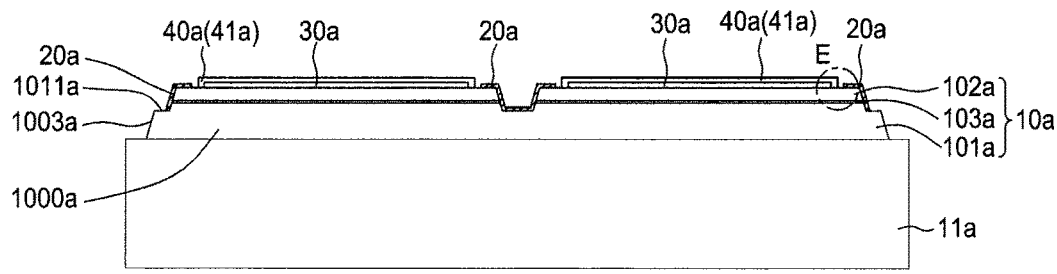

In an embodiment of the present application, following the step of forming the transparent conductive layer, as a top view in FIG. 5A, an enlarged view of the area B in FIG. 5B, an enlarged view of the area C in FIG. 5C, a cross-sectional view in FIG. 5D which is taken along line A-A' of FIG. 5A, and an enlarged view of the area E in FIG. 5E show, the manufacturing method of the light-emitting device 1 comprises a step of forming a reflective structure. A reflective structure 400 is directly formed on the transparent conductive layer 30a by physical vapor deposition or chemical vapor deposition, wherein the reflective structure 400 comprises a reflective layer 40a and/or a barrier layer 41a. The reflective layer 40a is between the transparent conductive layer 30a and the barrier layer 41a. In an embodiment of the present application, an outer edge 401a of the reflective layer 40a can be disposed on the inner side or the outer side of the outer edge 301a of the transparent conductive layer 30a, or disposed to overlap with the outer edge 301a of the transparent conductive layer 30a. An outer edge 411a of the barrier layer 41a can be disposed on the inner side or the outer side of the outer edge 401a of the reflective layer 40a or be provided to overlap with the outer edge 401a of the reflective layer 40a. As the enlarged views in FIG. 5B, FIG. 5C, and FIG. 5E show, the outer edge 401a of the reflective layer 40a does not overlap with the outer edge 301a of the transparent conductive layer 30a, the outer edge 301a of the transparent conductive layer 30a is covered by the reflective layer 40a, and the barrier layer 41a does not contact the transparent conductive layer 30a.

In another embodiment of the present application, the step of forming the transparent conductive layer can be omitted and the step of forming the reflective structure is directly performed after the step of forming the mesa or after the step of forming the first insulating layer, for example, the reflective layer 40a and/or the barrier layer 41a is directly formed on the second semiconductor layer 102a and the reflective layer 40a is formed between the second semiconductor layer 102a and the barrier layer 41a.

The material of the reflective layer 40a comprises a metal material having high reflectance, such as metal, for example, silver (Ag), aluminum (Al), or rhodium (Rh), or an alloy of the above materials. The high reflectance referred to herein means having 80% or more reflectance for a wavelength of a light emitted from the light-emitting device 1. In an embodiment of the present application, the barrier layer 41a covers the reflective layer 40a to prevent the surface of the reflective layer 40a from being oxidized that deteriorates the reflectivity of the reflective layer 40a. The material of the barrier layer 41a comprises metal material, such as titanium (Ti), tungsten (W), aluminum (Al), indium (In), tin (Sn), nickel (Ni), platinum (Pt), or an alloy of the above materials. In an embodiment, the reflective layer 40a is covered by one barrier layer 41a. In another embodiment, the reflective layer 40a is covered by multiple barrier layers, such as titanium (Ti)/aluminum (Al) and/or titanium (Ti)/tungsten (W). In an embodiment of the present application, the barrier layers 41a comprise titanium (Ti)/tungsten (W) on the side closer to the reflective layer 40a and titanium (Ti)/aluminum (Al) on the side away from the reflective layer 40a. In one embodiment of the present application, the material of the reflective layer 40a and the barrier layer 41a comprises a metal material other than gold (Au) or copper (Cu) to prevent the metal of the solder material, for example, tin (Sn), from diffusing into the light-emitting device 1 and forming reaction with the interior metal material of the light-emitting device 1, which results in a structural deformation of the light-emitting device 1 during the subsequent manufacturing process.

Figure 6A:
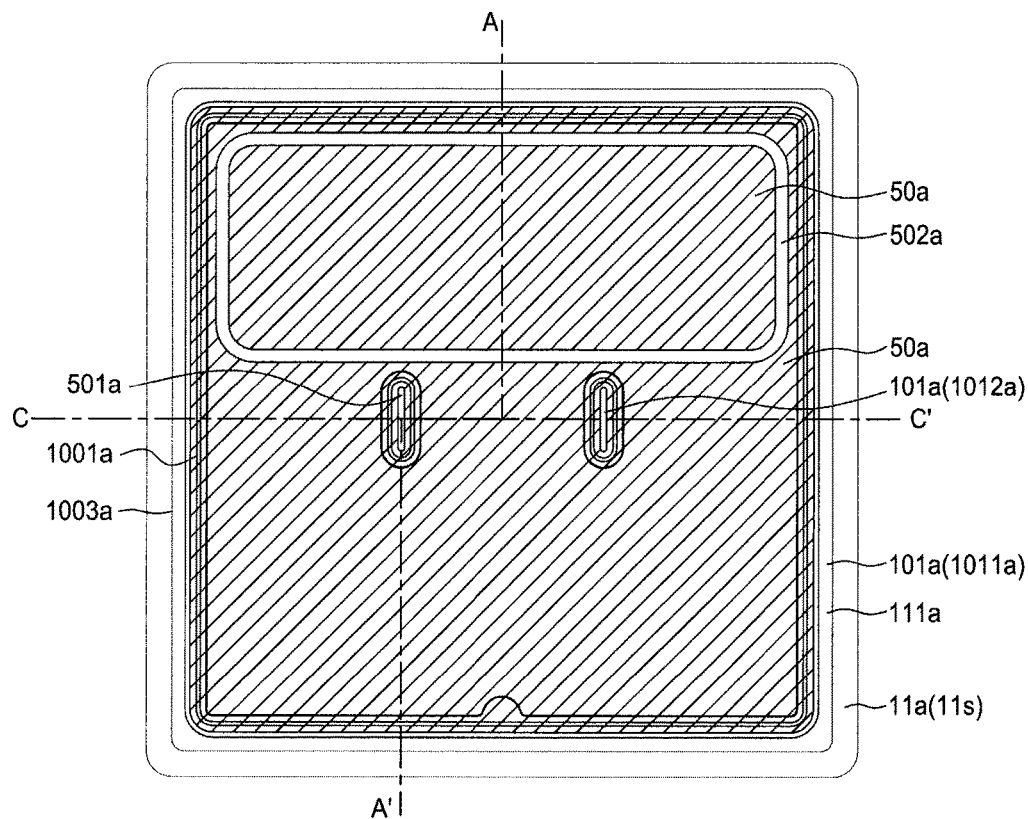
Figure 6B:
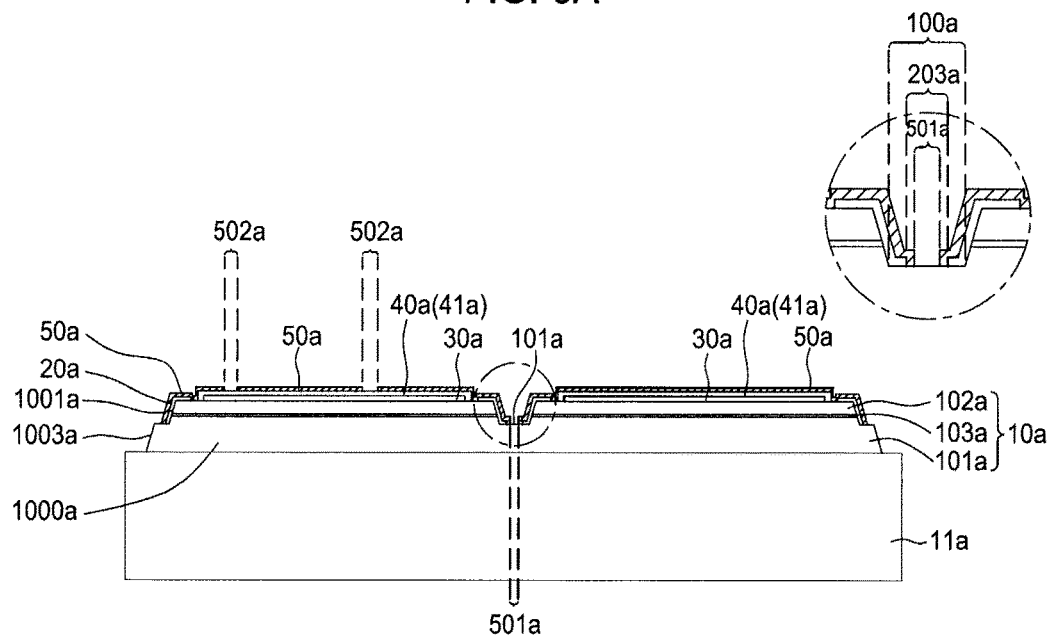

In an embodiment of the present application, following the step of forming the reflective structure, as a top view in FIG. 6A and a cross-sectional view in FIG. 6B which is taken along line A-A' of FIG. 6A show, the manufacturing method of the light-emitting device 1 comprises a step of forming a second insulating layer. A second insulating layer 50a is formed on the semiconductor structure 1000a by physical vapor deposition or chemical vapor deposition, and then patterned by lithography and etching to form one or a first group of second insulating openings 501a exposing the first semiconductor layer 101a, and one or a second group of second insulating openings 502a exposing the reflective layer 40a or the barrier layer 41a. During the patterning of the second insulating layer 50a, the first insulating surrounding regions 200a which cover the surrounding part 111a and the first group of first insulating covering regions 201a are partially etched to expose the first semiconductor layer 101a. A first group of first insulating openings 203a in the vias 100a is formed to expose the first semiconductor layer 101a.

In the embodiment, as the top view in FIG. 6A and the cross-sectional view in FIG. 6B show, the first group of second insulating openings 501a comprises a shape or an amount corresponding to a shape or an amount of the vias 100a. The second insulating openings 501a on the first semiconductor layer 101a and the second insulating openings 502a on the second semiconductor layer 102a comprise different shape, width, or amount. The top view of the second insulating opening 501a or 502a comprises an annular opening.

In the embodiment, as FIG. 6A shows, the second insulating openings 501a on the first semiconductor layer 101a are separated from each other and respectively corresponding to the vias 100a. The second insulating opening 502a on the second semiconductor layer 102a is adjacent to one side of the substrate 11a, for example, the left side or the right side of the central line C-C' of the substrate 11a. When the second insulating layer 50a includes one layer, the second insulating layer 50a protects the sidewalls of the semiconductor structure 1000a and prevents the active layer 103a from being destructed by subsequent processes. When multiple second insulating layers 50a are formed on the semiconductor structure 1000a, the multiple second insulating layers 50a comprise two or more different refractive index materials alternately stacked to form a Distributed Bragg reflector (DBR) which can selectively reflect light of a specific wavelength. The one or the multiple second insulating layers 50a are formed of a non-conductive material comprising organic material, such as Su8, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, fluorocarbon polymer, or inorganic material, such as silicone, glass, or dielectric material, such as aluminium oxide ($Al_2O_3$), silicon nitride ($SiN_x$), silicon oxide ($SiO_x$), titanium oxide ($TiO_x$), or magnesium fluoride ($MgF_x$).

Figure 7A:
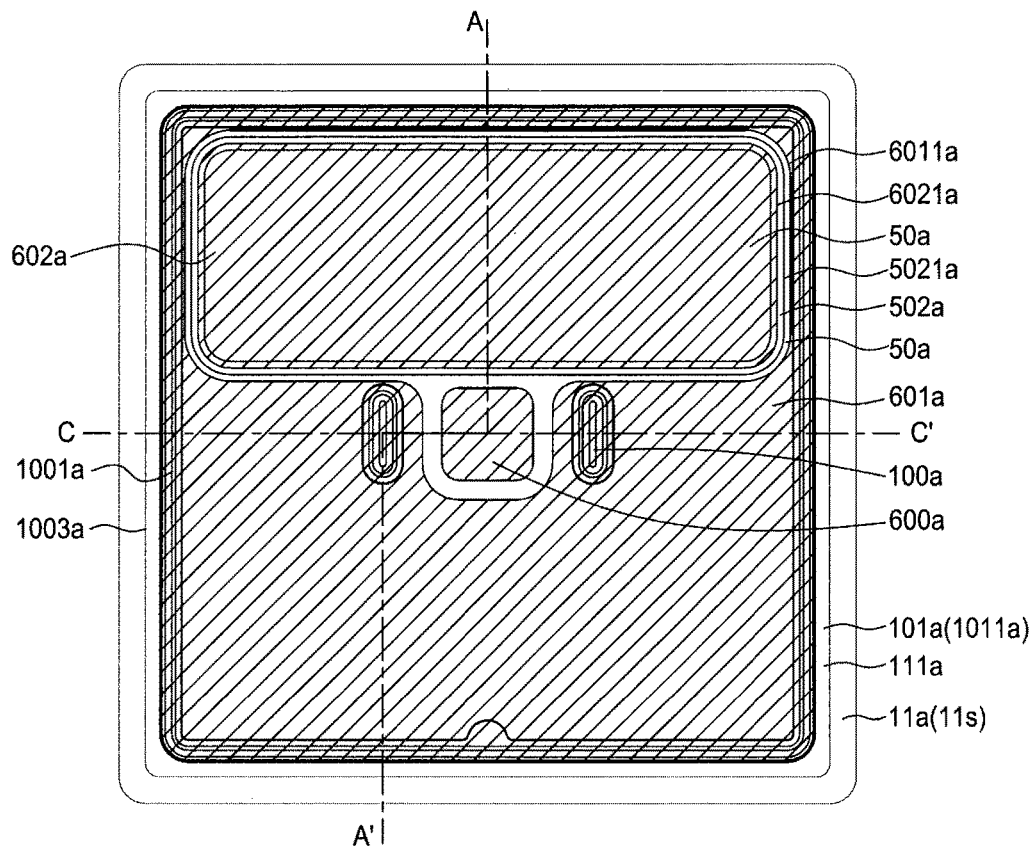
Figure 7B:
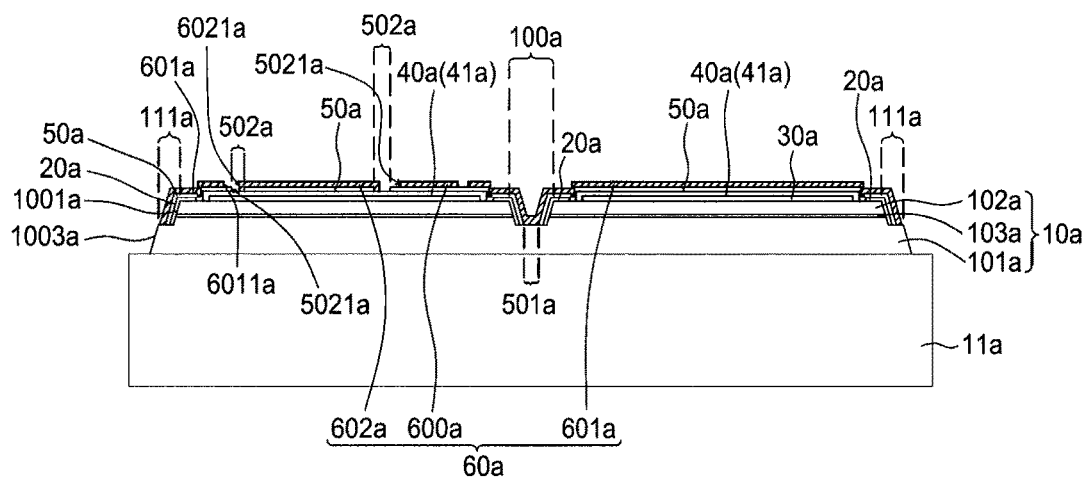

Following the step of forming the second insulating layer, as a top view in FIG. 7A and a cross-sectional view in FIG. 7B which is taken along line A-A' of FIG. 7A show, the manufacturing method of the light-emitting device 1 comprises a step of forming a contact layer. A contact layer 60a can be formed on the semiconductor stack 10a by physical vapor deposition or chemical vapor deposition, and then patterned by lithography and etching to form a first contact layer 601a, a second contact layer 602a, and a pin region 600a. The first contact layer 601a is filled into the via 100a to cover the second insulating openings 501a, contact the first semiconductor layer 101a, and cover partial surface of the second insulating layer 50a and the second semiconductor layer 102a. The first contact layer 601a is insulated from the second semiconductor layer 102a by the second insulating layer 50a. The second contact layer 602a is formed in the annular opening 502a of the second insulating layer 50a to contact part of the reflective layer 40a and/or the barrier layer 41a.

In an embodiment of the present application, the first contact layer 601a, the second contact layer 602a, and the pin region 600a are separated from each other with a distance. The second contact layer 602a is partially formed in the annular opening 502a of the second insulating layer 50a. A sidewall 6021a of the second contact layer 602a is separated from a sidewall 5021a of the annular opening 502a with a distance and a sidewall 6011a of the first contact layer 601a is separated from the sidewall 6021a of the second contact layer 602a with a distance. The first contact layer 601a does not contact the second contact layer 602a, and the first contact layer 601a and the second contact layer 602a are electrically insulated from each other by a part of the second insulating layer 50a. Viewing from the top view of the light-emitting device 1, the first contact layer 601a covers the surrounding part 111a of the semiconductor stack 10a and surrounds multiple sidewalls of the second contact layer 602a.

In an embodiment of the present application, the first contact layer 601a contacts the first semiconductor layer 101a by the surrounding part 111a and the vias 100a. When an external current is injected into the light-emitting device 1, one part of the electrical current is conducted to the first semiconductor layer 101a through the surrounding part 111a and another part of the electrical current is conducted to the first semiconductor layer 101a through the vias 100a.

As FIG. 7A shows, the second contact layer 602a is adjacent to one side of the substrate 11a, for example, the left side or the right side of the central line C-C' of the substrate 11a. The pin region 600a is formed at a geometric center of the semiconductor stack 10a in the top view of the light-emitting device 1. The pin region 600a does not contact the first contact layer 601a and the second contact layer 602a. The pin region 600a is electrically insulated from the first contact layer 601a and the second contact layer 602a. The pin region 600a comprises a material the same as that of the first contact layer 601a and/or the second contact layer 602a. The pin region 600a serves as a structure for protecting the epitaxial stack to prevent the epitaxial stack from being damaged by the probe or pin in the subsequent processes, such as die transfer die testing, encapsulation. The pin region 600a comprises a shape comprising rectangular, oval or circular.

In an embodiment of the present application, the pin region 600a is formed at a geometric center of the semiconductor stack 10a. The pin region 600a is connected to the first contact layer 601a or the second contact layer 602a. The pin region 600a comprises a material the same as that of the first contact layer 601a and/or the second contact layer 602a.

In order to reduce the resistance contacting with the first semiconductor layer 101a, the material of the contact layer 60a comprises a metal material, such as chromium (Cr), titanium (Ti), tungsten (W), gold (Au), aluminum (Al), indium (In), tin (Sn), nickel (Ni), platinum (Pt), or an alloy of the above materials. The material of the contact layer 60a comprises a metal material other than gold (Au), copper (Cu) to prevent the metal of the solder material, for example, tin (Sn), from diffusing into the light-emitting device 1 and forming reaction with the interior metal material of the light-emitting device 1, which results in a structural deformation of the light-emitting device 1 during the subsequent manufacturing processes.

In an embodiment of the present application, the material of the contact layer 60a comprises a metal having high reflectivity, such as aluminum (Al) or platinum (Pt).

In an embodiment of the present application, one side of the contact layer 60a contacting with the first semiconductor layer 101a comprises chromium (Cr) or titanium (Ti) to increase the bonding strength between the contact layer 60a and the first semiconductor layer 101a.

Figure 8A:
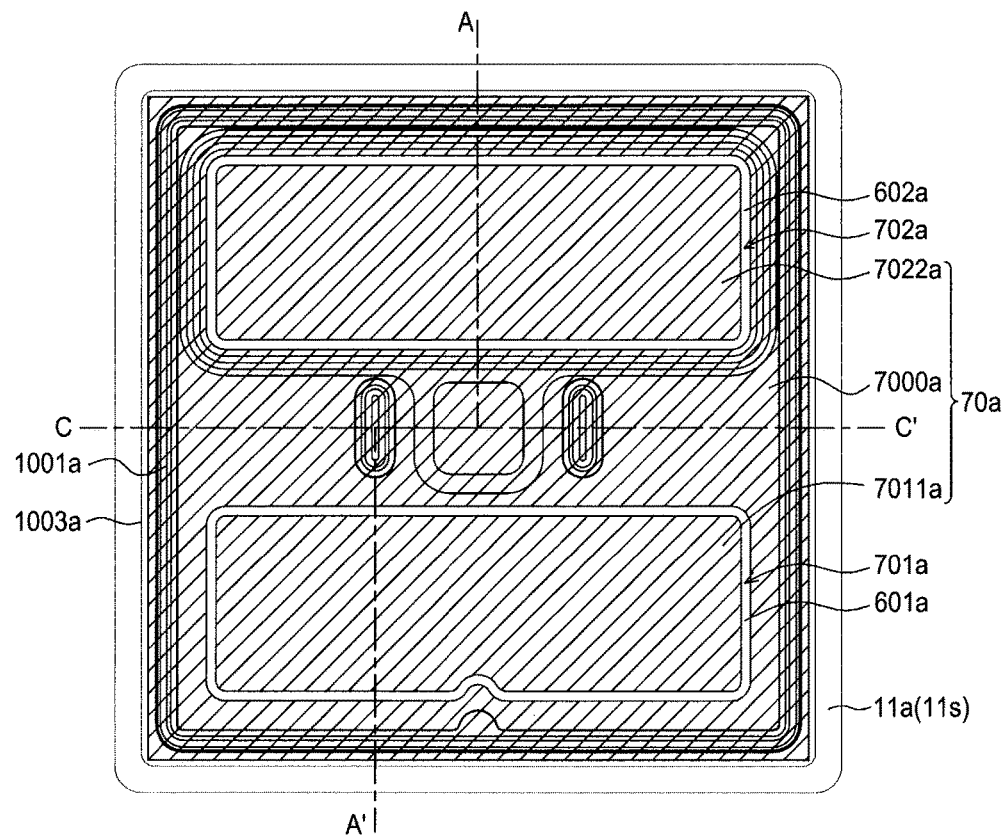
Figure 8B:
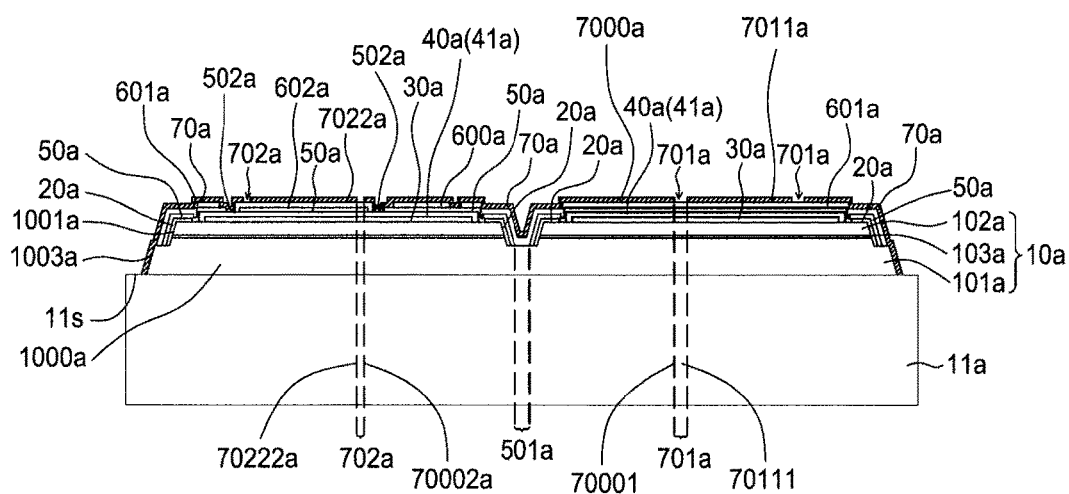

In an embodiment of the present application, following the step of forming the contact layer of FIG. 7A and FIG. 7B, the manufacturing method of the light-emitting device 1 comprises a step of forming a third insulating layer. As a top view in FIG. 8A and a cross-sectional view in FIG. 8B which is taken along line A-A' of FIG. 8A show, a third insulating layer 70*a* is formed on the semiconductor structure 1000*a* by physical vapor deposition or chemical vapor deposition, and then patterned by lithography and etching to form third insulating openings 701*a*, 702*a* which respectively exposes the first contact layer 601*a* and the second contact layer 602*a*. A first portion 7011*a* of the third insulating layer 70*a* is surrounded by the third insulating openings 701*a*. A second portion 7022*a* of the third insulating layer 70*a* is surrounded by the third insulating opening 702*a*. A connecting portion 7000*a* of the third insulating layer 70*a* is between the third insulating opening 701*a* and the third insulating opening 702*a*. As FIG. 8A shows, the connecting portion 7000*a* of the third insulating layer 70*a* surrounds the first portion 7011*a* and the second portion 7022*a* of the third insulating layer 70*a*. As FIG. 8B shows, the connecting portion 7000*a* of the third insulating layer 70*a* is formed on two sides of the first portion 7011*a* of the third insulating layer 70*a* and on two sides of the second portion 7022*a* of the third insulating layer 70*a*. The third insulating opening 701*a* is formed by a first side 70111 of the first portion 7011*a* of the third insulating layer 70*a* and one side 70001 of the connecting portion 7000*a* of the third insulating layer 70*a*. The third insulating opening 702*a* is formed by a second side 70222 of the second portion 7022*a* of the third insulating layer 70*a* and another side 70002*a* of the connecting portion 7000*a* of the third insulating layer 70*a*.

In an embodiment of the present application, the first contact layer 601*a* is between the second insulating layer 50*a* and the third insulating layer 70*a*. The pin region 600*a* is surrounded and covered by the connecting portion 7000*a* of the third insulating layer 70*a*.

In an embodiment of the present application, as FIG. 8A shows, the third insulating openings 701*a*, 702*a* and the vias 100*a* are staggered and not overlapping with each other. In other words, the third insulating opening 701*a* and the second insulating opening 501*a* are staggered and not overlapping with each other. In the top view of FIG. 8A, the third insulating openings 701*a*, 702*a* are respectively formed on two sides of the central line C-C' of the substrate 11*a*, for example, the third insulating opening 701*a* is formed on the right side of the central line C-C' of the substrate 11*a*; the third insulating opening 702*a* is formed on the left side of the central line C-C' of the substrate 11*a*.

In an embodiment of the present application, the third insulating opening 701*a* comprises a width smaller than a width of the second insulating opening 501*a*. The third insulating opening 702*a* comprises a width smaller than a width of the second insulating opening 502*a*.

In an embodiment of the present application, the third insulating opening 701*a* comprises a width larger than a width of the second insulating opening 501*a*. The third insulating opening 702*a* comprises a width larger than a width of the second insulating opening 502*a*.

In an embodiment, multiple third insulating layers 70*a* comprise two or more different refractive index materials alternately stacked to form a Distributed Bragg reflector (DBR), which can selectively reflect light of a specific wavelength. The third insulating layer 70*a* is formed of a non-conductive material and comprising organic material, such as Sub, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, fluorocarbon polymer, or inorganic material, such as silicone, glass, or dielectric material, such as aluminum oxide ($Al_2O_3$), silicon nitride ($SiN_x$), silicon oxide ($SiO_x$), titanium oxide ($TiO_x$), or magnesium fluoride ($MgF_x$).

Figure 9A:
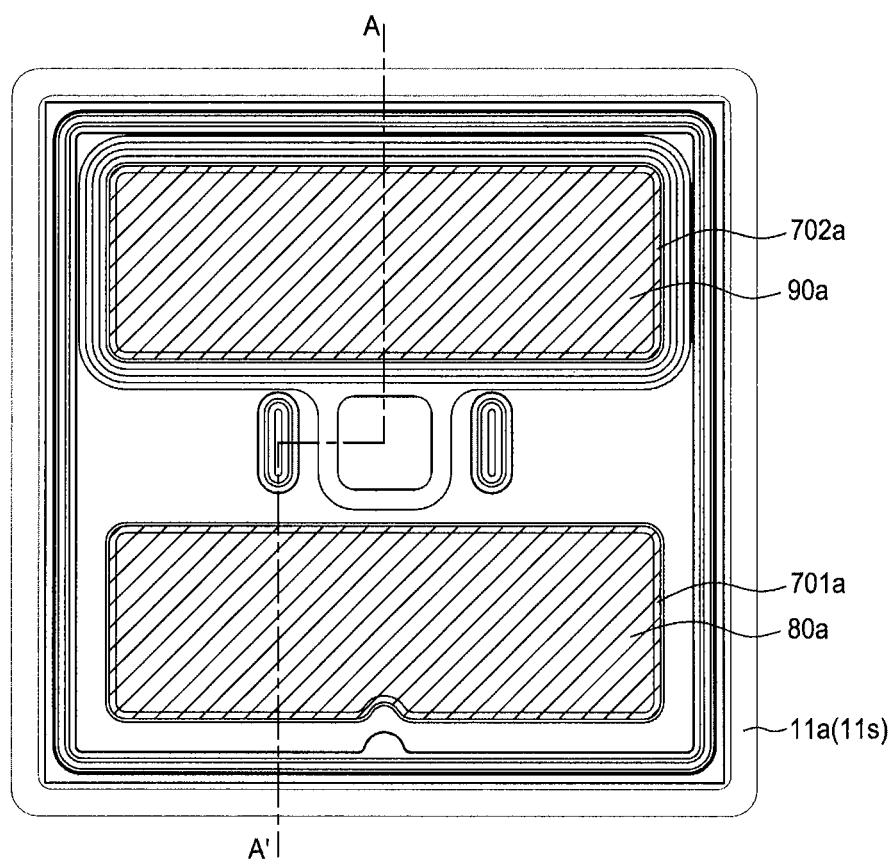

Following the step of forming the third insulating layer, the manufacturing method of the light-emitting device 1 comprises a step of forming a pad. As a top view in FIG. 9A and a cross-sectional view in FIG. 9B which is taken along line A-A' of FIG. 9A show, a first pad 80*a* and a second pad 90*a* can be formed on one or more semiconductor structures 1000*a* by plating, sputter or vapor deposition. In the top view of FIG. 9A, the first pad 80*a* is adjacent to one side of the substrate 11*a*, for example, the right side of the central line C-C' of the substrate 11*a*. The second pad 90*a* is adjacent to another side of the substrate 11*a*, for example, the left side of the central line C-C' of the substrate 11*a*. The first pad 80*a* covers the third insulating opening 701*a* to contact the first contact layer 601*a* and is electrically connected to the first semiconductor layer 101*a* by the first contact layer 601*a* and the via 100*a*. The second pad 90*a* covers the third insulating opening 702*a* to contact the second contact layer 602*a* and is electrically connected to the second semiconductor layer 102*a* through the second contact layer 602*a*, the reflective layer 40*a*, or the barrier layer 41*a*. As FIG. 9A shows, the first pad 80*a* and the second pad 90*a* do not cover any via 100*a* and the via 100*a* is formed outside the first pad 80*a* and the second pad 90*a*.

In an embodiment of the present application, the first pad 80*a* comprises a size the same as or different from that of the second pad 90*a*, wherein the size is width or area.

Figure 9B:
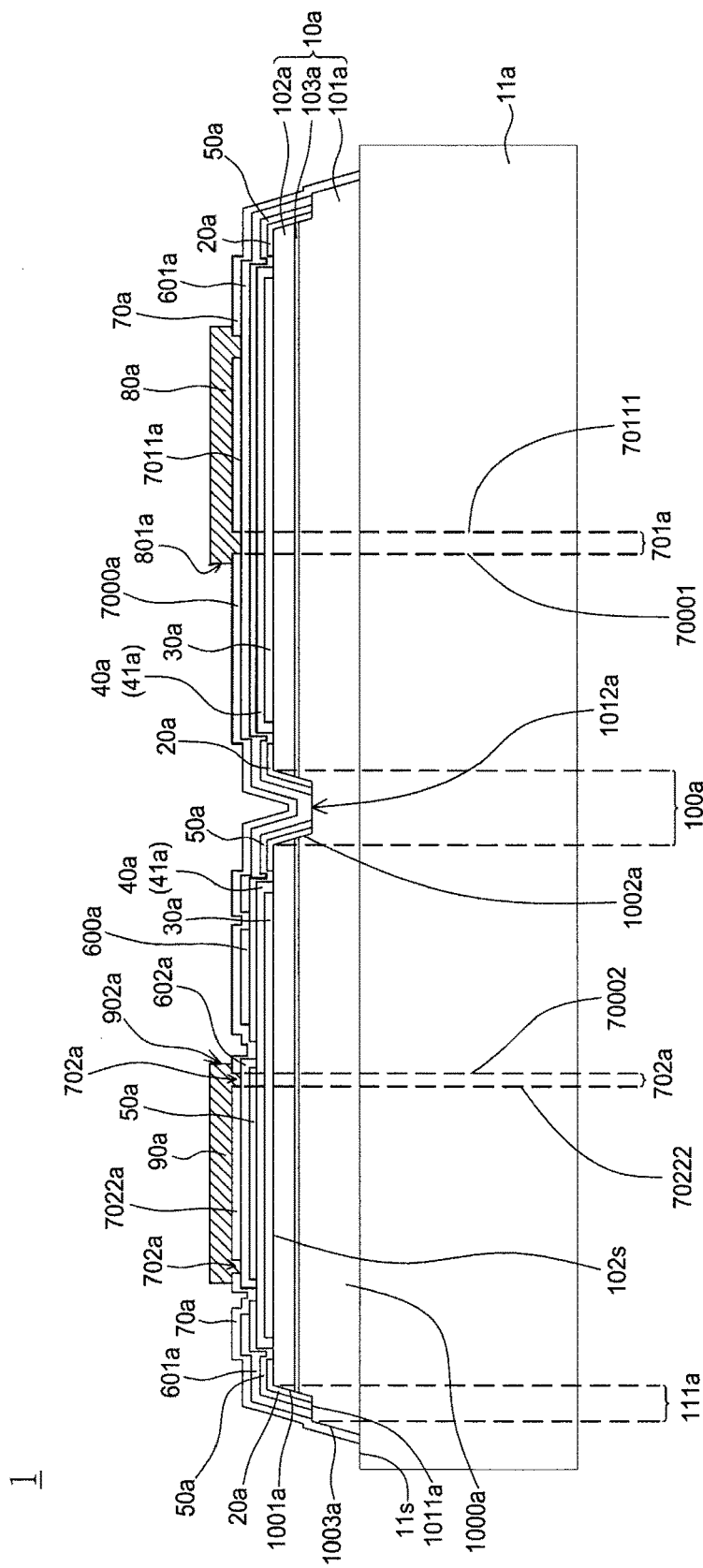

In an embodiment of the present application, as FIG. 9B shows, the first pad 80*a* comprises a side 801*a* separated from the first side 70111 of the first portion 7011*a* of the third insulating layer 70*a* or the one side 70001 of the connecting portion 7000*a* of the third insulating layer 70*a* with a distance; the distance is preferably smaller than 100 μm, more preferably smaller than 50 μm, and most preferably smaller than 20 μm. The second pad 90*a* comprises a side 902*a* separated from the second side 70222 of the second portion 7022*a* of the third insulating layer 70*a* or the another side 70002 of the connecting portion 7000*a* of the third insulating layer 70*a* with a distance; the distance is preferably smaller than 100 μm, more preferably smaller than 50 μm, and most preferably smaller than 20 μm.

In an embodiment of the present application, in the top view of the light-emitting device 1, the side 801*a* of the first pad 80*c* is formed along one side 70001 of the connecting portion 7000*a* and the first side 70111 of the first portion 7011*a*. The side 902*a* of the second pad 90*a* is formed along another side 70002*a* of the connecting portion 7000*a* and the second side 70222*a* of the second portion 7022*a*.

FIG. 9A illustrates a top view of the light-emitting device 1 in accordance with an embodiment of the present application. FIG. 9B illustrates a cross-sectional view of the light-emitting device 1 in accordance with an embodiment of the present application. The light-emitting device 1 disclosed in the present embodiment is a flip chip light-emitting diode. The light-emitting device 1 comprises a substrate 11*a*; one or more semiconductor structures 1000*a* on the substrate 11*a*; a surrounding part 111*a* surrounding the one or more semiconductor structures 1000*a*; and a first pad 80*a* and a second pad 90*a* formed on the one or more semiconductor structures 1000*a*. Each of the one or more semiconductor structures 1000*a* comprises a semiconductor stack 10*a* comprising a first semiconductor layer 101a, a second semiconductor layer 102a, and an active layer 103a between the first semiconductor layer 101a and the second semiconductor layer 102a.

As FIG. 9A and FIG. 9B show, the one or more semiconductor structures 1000a is surrounded by the surrounding part 111a. In an embodiment of the present application, the semiconductor structures 1000a are connected to each other through the first semiconductor layer 101a, the surrounding part 111a comprises the first surface 1011a of the first semiconductor layer 101a to surround the semiconductor structures 1000a. In another embodiment of the present application, the semiconductor structures 1000a are separated from each other with a distance to expose a surface 11s of the substrate 11a.

The light-emitting device 1 further comprises one or multiple vias penetrating the second semiconductor layer 102a and the active layer 103a to expose the one or more second surfaces 1012a of the first semiconductor layer 101a.

The light-emitting device 1 further comprises a first contact layer 601a formed on the first surface 1011a of the first semiconductor layer 101a to surround the semiconductor structure 1000a and contact the first semiconductor layer 101a for forming electrical connection, and formed on the one or more second surfaces 1012a of the first semiconductor layer 101a to cover the one or multiple vias 100a and contact the first semiconductor layer 101a for forming electrical connection, and a second contact layer 602a formed on the surface 102s of the second semiconductor layer 102a. In an embodiment of the present application, in the top view of light-emitting device 1, as FIG. 7A shows, the first contact layer 601a surrounds multiple sidewalls of the second contact layer 602a.

In an embodiment of the present application, the first pad 80a and/or the second pad 90ac cover the multiple semiconductor structures 1000a.

In an embodiment of the present application, the first pad 80a and the second pad 90a are formed to around the vias 100a. The first pad 80a and the second pad 90a do not cover the vias 100a.

In an embodiment of the present application, in the top view of the light-emitting device 1, the first pad 80a comprises a shape the same as a shape of the second pad 90a, for example, the first pad 80a and the second pad 90a comprise rectangular shape as shown in FIG. 9A.

In an embodiment of the present application, the first pad 80a comprises a size different from that of the second pad 90a, for example, the area of the first pad 80a is larger or smaller than the area of the second pad 90a. The materials of the first pad 80a and the second pad 90a comprise metal material, such as chromium (Cr), titanium (Ti), tungsten (W), aluminum (Al), indium (In), tin (Sn), nickel (Ni), platinum (Pt), or an alloy of the above materials. Each of the first pad 80a and the second pad 90a includes one layer or multiple layers. When the first pad 80a and the second pad 90a each includes multiple layers, the first pad 80a comprises a first upper pad and a first lower pad; the second pad 90a comprises a second upper pad and a second lower pad. Each of the upper pad and the lower pad has different functions.

In an embodiment of the present application, the function of the upper pad is used for soldering and wiring. The light-emitting device 1 can be flipped and mounted onto the package substrate by using solder bonding or AuSn eutectic bonding through the upper pad. The metal material of the upper pad comprises highly ductile materials such as nickel (Ni), cobalt (Co), iron (Fe), titanium (Ti), copper (Cu), gold (Au), tungsten (W), zirconium (Zr), molybdenum (Mo), tantalum (Ta), aluminum (Al), silver (Ag), platinum (Pt), palladium (Pd), rhodium (Rh), iridium (Ir), ruthenium (Ru), osmium (Os). The upper pad includes one layer or multiple layers of the above materials. In an embodiment of the present application, the material of the upper pad comprises nickel (Ni) and/or gold (Au) and the upper pad includes one layer or multiple layers.

In an embodiment of the present application, the function of the lower pad is for forming a stable interface with the contact layer 60a, the reflective layer 40a, or the barrier layer 41a to improve the interface bonding strength between the first lower pad and the first contact layer 601a, or enhance the interface bonding strength of the second lower pad and the reflective layer 40a or the barrier layer 41a. Another function of the lower pad is to prevent tin (Sn) in the solder or AuSn from diffusing into the reflective structure and damaging the reflectivity of the reflective structure. Therefore, the lower pad comprises a metal material other than gold (Au) and copper (Cu), such as nickel (Ni), cobalt (Co), iron (Fe), titanium (Ti), tungsten (W), zirconium (Zr), molybdenum (Mo), tantalum (Ta), aluminum (Al), silver (Ag), platinum (Pt), palladium (Pd), rhodium (Rh), iridium (Ir), ruthenium (Ru), osmium (Os), the lower pad includes one layer or multiple layers of the above materials. In an embodiment of the present application, the lower pad includes multiple layers of titanium (Ti) and aluminum (Al), or multiple layers of chromium (Cr) and aluminum (Al).

In an embodiment of the present application, in order to prevent tin (Sn) of the solder material or AuSn from diffusing into the reflective structure to destroy the reflectivity of the reflective structure, one side of the first contact layer 601a contacting the first pad 80a comprises a metal material such as titanium (Ti) and platinum (Pt). One side of the second contact layer 602a contacting the second pad 90a comprises a metal material such as titanium (Ti) and platinum (Pt).

Figure 10A:
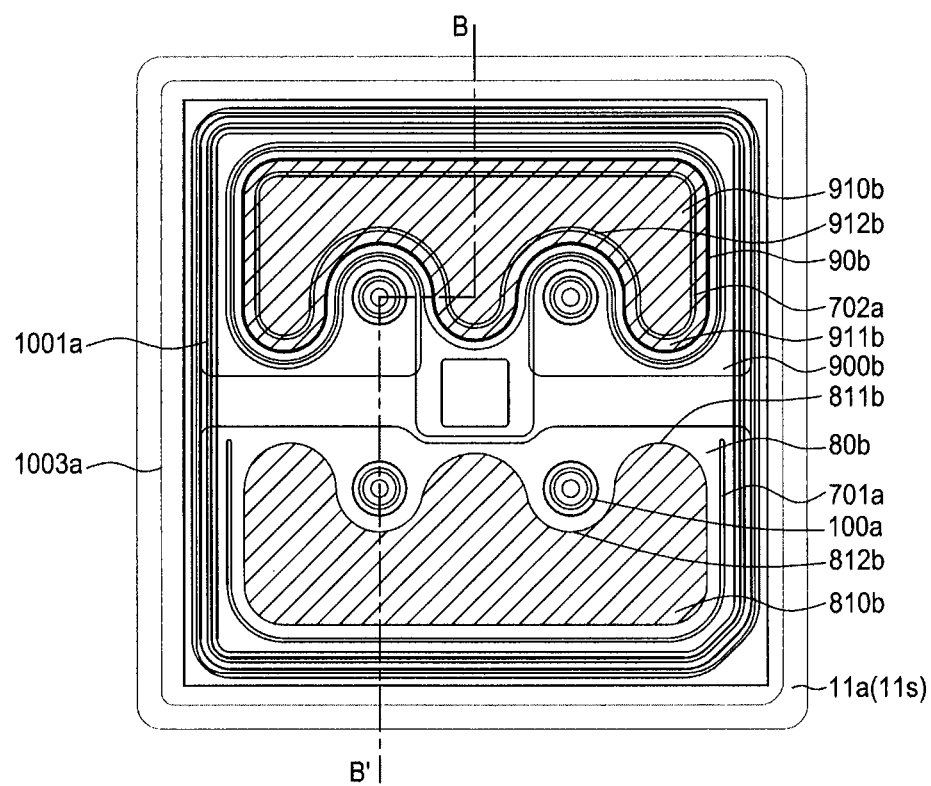
FIG. 10A illustrates a top view of a light-emitting device 2 in accordance with an embodiment of the present application.
Figure 10B:
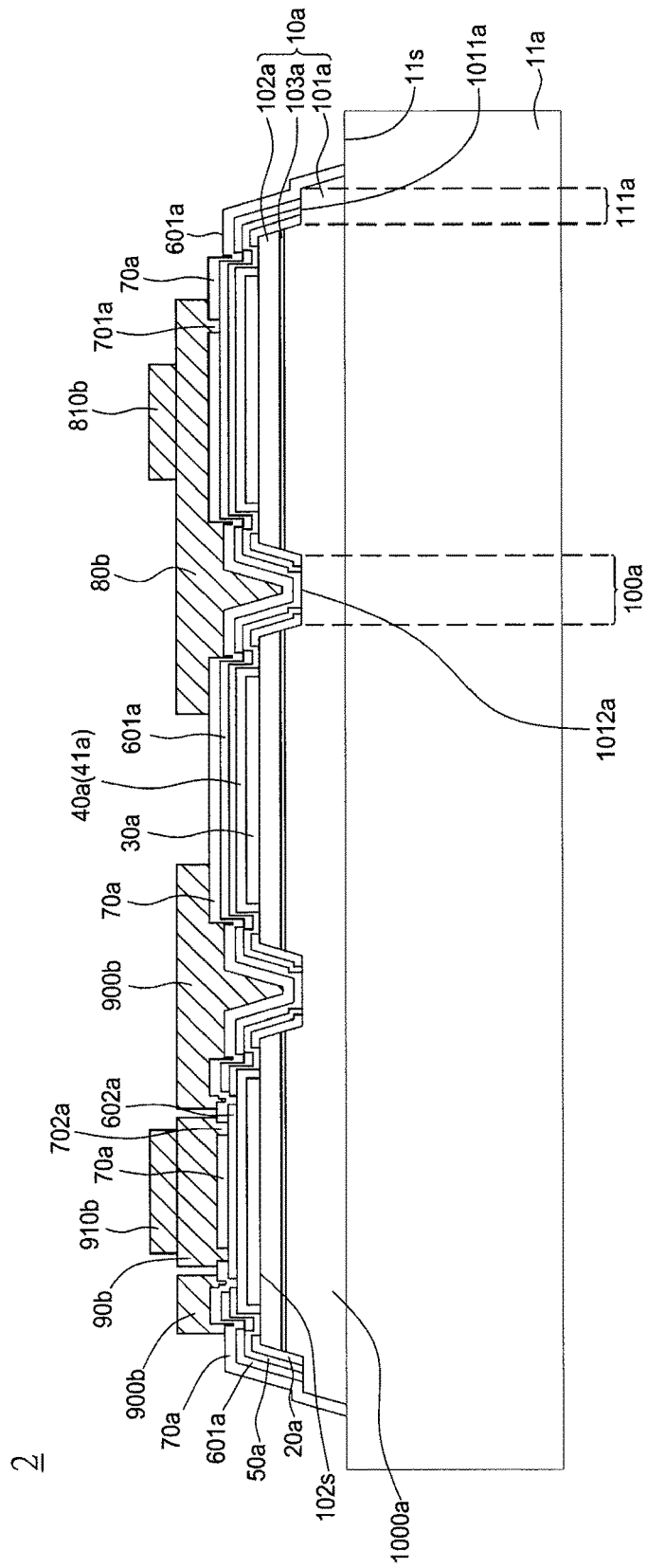
FIG. 10B illustrates a cross-sectional view of the light-emitting device 2 in accordance with an embodiment of the present application.

FIG. 10A illustrates a top view of the light-emitting device 2 in accordance with an embodiment of the present application. FIG. 10B illustrates a cross-sectional view of the light-emitting device 2. As compared with the light-emitting device 1 of the above embodiment, the light-emitting device 2 further comprises a metal layer 900b surrounding multiple sides of the first pad 80b and/or the second pad 90b, and a first electrode bump 810b and a second electrode bump 910b respectively formed on the first pad 80b and the second pad 90b. In addition, the light-emitting device 2 comprises the same structure as that of the light-emitting device 1 and therefore, the structure named by same terms or labelled by same numbers of the light-emitting device 8 shown in FIGS. 10A, 10B and the light-emitting device 1 shown in FIGS. 9A, 9B will be omitted in this description or not repeat them in the following description.

The light-emitting device 2 disclosed in the present embodiment is a flip chip light-emitting diode. The light-emitting device 2 comprises a substrate 11a; one or more semiconductor structures 1000a on the substrate 11a; a surrounding part 111a surrounding the one or more semiconductor structures 1000a; a first pad 80b and a second pad 90b formed on the semiconductor stack 10a; and a first electrode bump 810b and a second electrode bump 910b respectively formed on the first pad 80b and the second pad 90b. Each of the one or more semiconductor structures 1000a comprises a semiconductor stack 10a comprising a first semiconductor layer 101a, a second semiconductor layer 102a, and an active layer 103a between the first semiconductor layer 101a and the second semiconductor layer 102a.

As FIG. 10A and FIG. 10B show, the one or more semiconductor structures 1000a is surrounded by the surrounding part 111a. In an embodiment of the present application, the semiconductor structures 1000a are connected to each other through the first semiconductor layer 101a, the surrounding part 111a comprises the first surface 1011a of the first semiconductor layer 101a to surround the semiconductor structures 1000a. In another embodiment of the present application, the semiconductor structures 1000a are separated from each other with a distance to expose a surface 11s of the substrate 11a.

The light-emitting device 2 further comprises one or multiple vias penetrating the second semiconductor layer 102a and the active layer 103a to expose one or more second surfaces 1012a of the first semiconductor layer 101a.

The light-emitting device 2 further comprises a first contact layer 601a formed on the first surface 1011a of the first semiconductor layer 101a to surround the semiconductor structure 1000a and contact the first semiconductor layer 101a for forming electrical connection. The first contact layer 601a is also formed on the one or more second surfaces 1012a of the first semiconductor layer 101a to cover the one or multiple vias 100a and contact the first semiconductor layer 101a for forming electrical connection. The light-emitting device 2 further comprises a second contact layer 602a formed on the surface 102s of the second semiconductor layer 102a for forming electrical connection with the second semiconductor 102a. In an embodiment of the present application, in the top view of light-emitting device 2, the first contact layer 601a surrounds multiple sidewalls of the second contact layer 602a and the second contact layer 602a comprises a size smaller than a size of the first contact layer 601a, for example, the second contact layer 602a comprises an area smaller than an area of the first contact layer 601a.

In an embodiment of the present application, the first pad 80b covers partial or all of the vias 100a and/or the second pad 90b covers partial or all of the vias 100a. As FIG. 10A shows, the first pad 80b covers a part of the vias 100a and the second pad 90b does not cover any via 100a.

When the light-emitting device is mounted on the package substrate in the form of flip-chip, the insulating layer on the outer surface of the light-emitting device is easily damaged by collision of an external force. The solder or the eutectic bonding material, for example, AuSn material, enters the interior of the light-emitting device through cracks of the insulating layer, which results in the failure of the light-emitting device. In an embodiment of the present application, the light-emitting device 2 comprises a metal layer 900b on the semiconductor stack 10a to protect the insulating layer from being damaged by collision of an external force. As FIG. 10A shows, the metal layer 900b surrounds the multiple sidewalls of the second pad 90b, and the metal layer 900b is spaced apart from the second pad 90b. The metal layer 900b covers a portion of the vias 100a. A portion of the first contact layer 601a is positioned under the metal layer 900b and is insulated from the metal layer 900b by a third insulating layer 70a.

In an embodiment of the present application, the first pad 80b, the second pad 90b and the metal layer 900b are separated from each other with a distance and do not connect to each other.

In an embodiment of the present application, the light-emitting device 2 comprises a third insulating layer 70a comprising one or more openings 701a, 702a respectively exposing the first contact layer 601a and the second contact layer 602a. A space is formed between the metal layer 900b and the second pad 90b to expose partial surface of the third insulating layer 70a.

In an embodiment of the present application, in the top view of the light-emitting device 2, the first pad 80b comprises a shape different from a shape of the second pad 90b, for example, the first ad 80b comprises a rectangular shape and the second pad 90b comprises a comb shape.

In an embodiment of the present application, in the top view of the light-emitting device 2, the first pad 80b comprises a size different from a size of the second pad 90b, for example, the first pad 80b comprises an area different from an area of the second pad 90b.

In an embodiment of the present application, the first pad 80b and the second pad 90b respectively comprises a size different from that of the first electrode bump 810b and the second electrode bump 910b, for example, the area of the first pad 80b is larger than the area of the first electrode bump 810b, the area of the second pad 90b is larger than the area of the second electrode bump 910b.

In an embodiment of the present application, a distance between the first pad 80b and the second pad 90b is smaller than a distance between the first electrode bump 810b and the second electrode bump 910b.

In an embodiment of the present application, in the top view of the light-emitting device 2, the shape of the first electrode bump 810b is similar to or the same as the shape of the second electrode bump 910b, for example, the first electrode bump 810b and the second electrode bump 910b comprise comb shape. As shown in FIG. 10A, the first electrode bump 810b comprises a plurality of first protrusions 811b and a plurality first recesses 812b that are alternately connected to one another. The second electrode bump 910b comprises a plurality of second protrusions 911b and a plurality of second recesses 912b that are alternately connected to one another. The position of the first recess 812b of the first electrode bump 810b and the position of the second recess 912b of the second electrode bump 910b substantially correspond to the positions of the vias 100a. In other words, a width of the first recess 812b of the first electrode bump 810b or a width of the second recess 912b of the second electrode bump 910b is larger than a diameter of any via 100a. The first electrode bump 810b and the second electrode bump 910b do not overlap any via 100a. The first recesses 812b of the first electrode bump 810b and the second recesses 912b of the second electrode bump 910b surround the vias 100a and are formed at a periphery of the vias 100a. In an embodiment of the present application, the plurality of first recesses 812b and the plurality of second recesses 912b are aligned in the top view. In another embodiment of the present application, the plurality of first recesses 812b and the plurality of second recesses 912b are staggered in the top view.

In an embodiment of the present application, the light-emitting device 2 is mounted onto the package substrate in a form of flip chip Multiple insulating layers are formed between the first pad 80b and the semiconductor stack, and between the second pad 90b and the semiconductor stack 10a. Solder bonding or AuSn eutectic bonding provides a stress on the first pad 80b and the second pad 90b of the light-emitting device 2, which forms cracks in the first pad 80b, second pad 90b and the insulating layer. The light-emitting device 2 comprises a first electrode bump 810b and a second electrode bump 910b respectively formed on the first pad 80b and the second pad 90b, wherein the first electrode bump 810b and the second electrode bump 910b are used for bonding, and the first electrode bump 810b and the second electrode bump 910b are formed around positions of the vias to reduce the stress forming between the electrode pad and the insulating layer.

In another embodiment of the present application, as compared with first electrode bump 810b and the second electrode bump 910b, the first pad 80b and the second pad 90b comprise larger area to release a stress from bonding of the first electrode bump 810b and the second electrode bump 910b. In the cross-sectional view of the light-emitting device 2, the first pad 80b comprises a width 1.2~2.5 times a width of the first electrode bump 810b, preferably 2 times.

In another embodiment of the present application, as compared with the first electrode bump 810b and the second electrode bump 910b, the first pad 80b and the second pad 90b comprise larger area to release a stress of the first electrode bump 810b and the second electrode bump 910b during bonding. In the cross-sectional view of the light-emitting device 2, the first pad 80b extends outward more than one times its own thickness, preferably more than two times its own thickness.

In another embodiment of the present application, the first electrode bump 810b and the second electrode bump 910b comprise a thickness between 1 μm and 100 μm, preferably between 1.5 μm and 6 μm. The light-emitting device is mounted onto the package substrate in a form of flip chip. The first pad 80d and the second pad 90d comprise a thickness larger than 0.2 μm, preferably larger than 0.5 μm and smaller than 1 μm to release a stress of the first electrode bump 810b and the second electrode bump 910b during bonding.

In another embodiment of the present application, the first pad 80b, the second pad 90b and the metal layer 900b comprise same metal material and/or same metal stack.

The first pad 80b, the second pad 90b and the metal layer 900b comprise a structure having one or more layers. The function of the first pad 80b and the second pad 90b is for forming a stable interface with the first contact layer 601a, the reflective layer 40a, or the barrier layer 41a. The first pad 80b contacts the first contact layer 601a, and the second pad 90b contacts the reflective layer 40a or the barrier layer 41a. The first pad 80b and the second pad 90b comprises a metal material other than gold (Au) and copper (Cu), such as chromium (Cr), nickel (Ni), cobalt (Co), iron (Fe), titanium (Ti), tungsten (W), zirconium (Zr), molybdenum (Mo), tantalum (Ta), aluminum (Al), silver (Ag), platinum (Pt), palladium (Pd), rhodium (Rh), iridium (Ir), ruthenium (Ru), osmium (Os) or alloys of the above materials, to prevent tin (Sn) in the solder or AuSn from diffusing into the light-emitting device 2 to form eutectic with gold (Au) and copper (Cu) of the first pad 80b and the second pad 90b. The metal layer 900b comprises a metal material other than gold (Au) and copper (Cu), such as chromium (Cr), nickel (Ni), cobalt (Co), iron (Fe), titanium (Ti), tungsten (W), zirconium (Zr), molybdenum (Mo), tantalum (Ta), aluminum (Al), silver (Ag), platinum (Pt), palladium (Pd), rhodium (Rh), iridium (Ir), ruthenium (Ru), osmium (Os) or alloys of the above materials. One side of the metal layer 900b contacting the third insulating layer 70a comprises chromium (Cr), nickel (Ni), titanium (Ti), or platinum (Pt) to increase an interface bonding strength between the metal layer 900b and the third insulating layer 70a.

In another embodiment of the present application, the first pad 80b and/or the second pad 90b includes multiple layers, wherein the multiple layers comprises a high ductility layer and a low ductility layer to prevent the stress from forming in the bonding between the pads 80b, 90b and the solder or AuSn from causing cracks in the insulating layer between the pads 80b, 90b and the semiconductor stack 10a. The high ductility layer and the low ductility layer comprise metals having a different Young's modulus.

In another embodiment of the present application, the high ductility layer of the first pad 80b and/or the second pad 90b comprises a thickness larger or equal to a thickness of the low ductility layer.

In another embodiment of the present application, the first pad 80b and/or the second pad 90b includes multiple layers, and the first electrode bump 810b and the second electrode bump 910b includes multiple layers. One side of the first pad 80b contacting the first electrode bump 810b comprises same material as that of the first electrode bump 810b, and one side of the second pad 90d contacting the second electrode bump 910b comprises same material as that of the second electrode bump 910b, for example, chromium (Cr), nickel (Ni), titanium (Ti), or platinum (Pt) to increase an interface bonding strength between the pad and the electrode bump.

In another embodiment of the present application, following the pad forming step, the manufacturing method the light-emitting device 2 comprises a fourth insulating forming step. A fourth insulating layer (not shown) is formed on the first pad 80b and the second pad 90b by physical vapor deposition or chemical vapor deposition, after that, the first electrode bump 810b and the second electrode bump 910b are respectively formed on the first pad 80b and the second pad 90b, wherein the fourth insulating layer surrounds the first pad 80b and the second pad 90b. In an embodiment, multiple fourth insulating layers comprise two or more materials having different refractive indexes alternately stacked to form a Distributed Bragg reflector (DBR), and selectively reflect light of a specific wavelength. The fourth insulating layer is formed of a non-conductive material comprising organic material, such as Sub, benzocyclobutene (BCB), perfluorocyclobutane (PFCB), epoxy resin, acrylic resin, cyclic olefin polymers (COC), polymethylmethacrylate (PMMA), polyethylene terephthalate (PET), polycarbonate (PC), polyetherimide, fluorocarbon polymer, or inorganic material, such as silicone, glass, or dielectric material, such as aluminum oxide ($Al_2O_3$), silicon nitride ($SiN_x$), silicon oxide ($SiO_x$), titanium oxide ($TiO_x$), or magnesium fluoride ($MgF_x$).

In an embodiment of the present application, the step of forming the first electrode bump 810b and the second electrode bump 910b is directly after the step of forming the first pad 80b and the second pad 90b. In another embodiment of the present application, after the step of forming the first pad 80b and the second pad 90b, the fourth insulating layer forming step is performed first, followed by the step of forming the first electrode bump 810b and the second electrode bump 910b.

Figure 11:
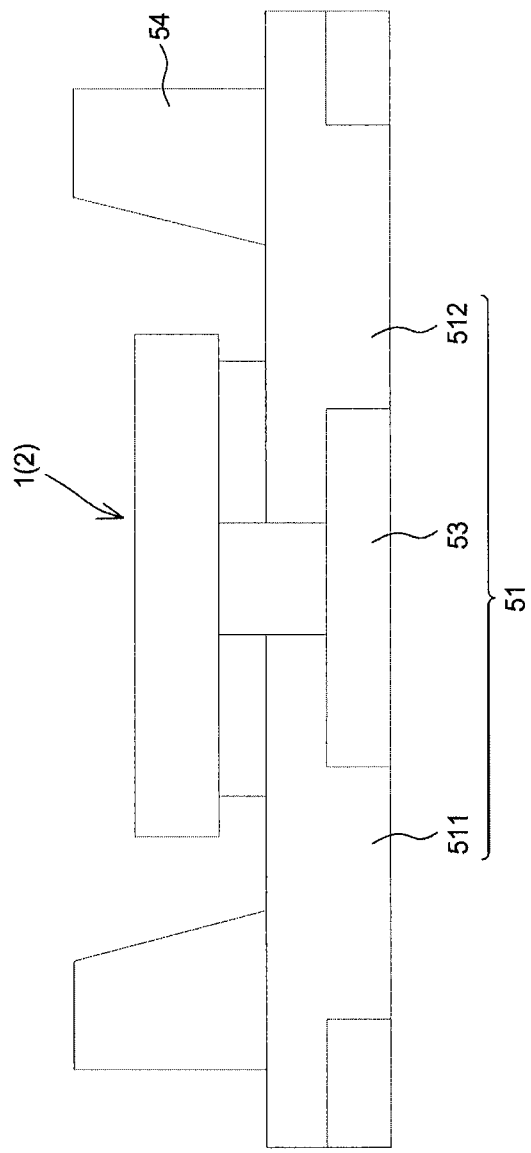
FIG. 11 illustrates a structure diagram of a light-emitting apparatus 3 in accordance with an embodiment of the present application.

FIG. 11 is a schematic view of a light-emitting apparatus 3 according to an embodiment of the present application. The light-emitting device 1 or 2 in the foregoing embodiment is mounted on the first spacer 511 and the second spacer 512 of the package substrate 51 in the form of flip chip. The first spacer 511 and the second spacer 512 are electrically insulated from each other by an insulating portion 53 comprising an insulating material. The main light-extraction surface of the flip-chip is the surface of the growth substrates to reduce the light absorption on the electrode surface. A reflective structure 54 can be provided around the light-emitting device 1 or 2 to increase the light extraction efficiency of the light-emitting apparatus.

Figure 12:
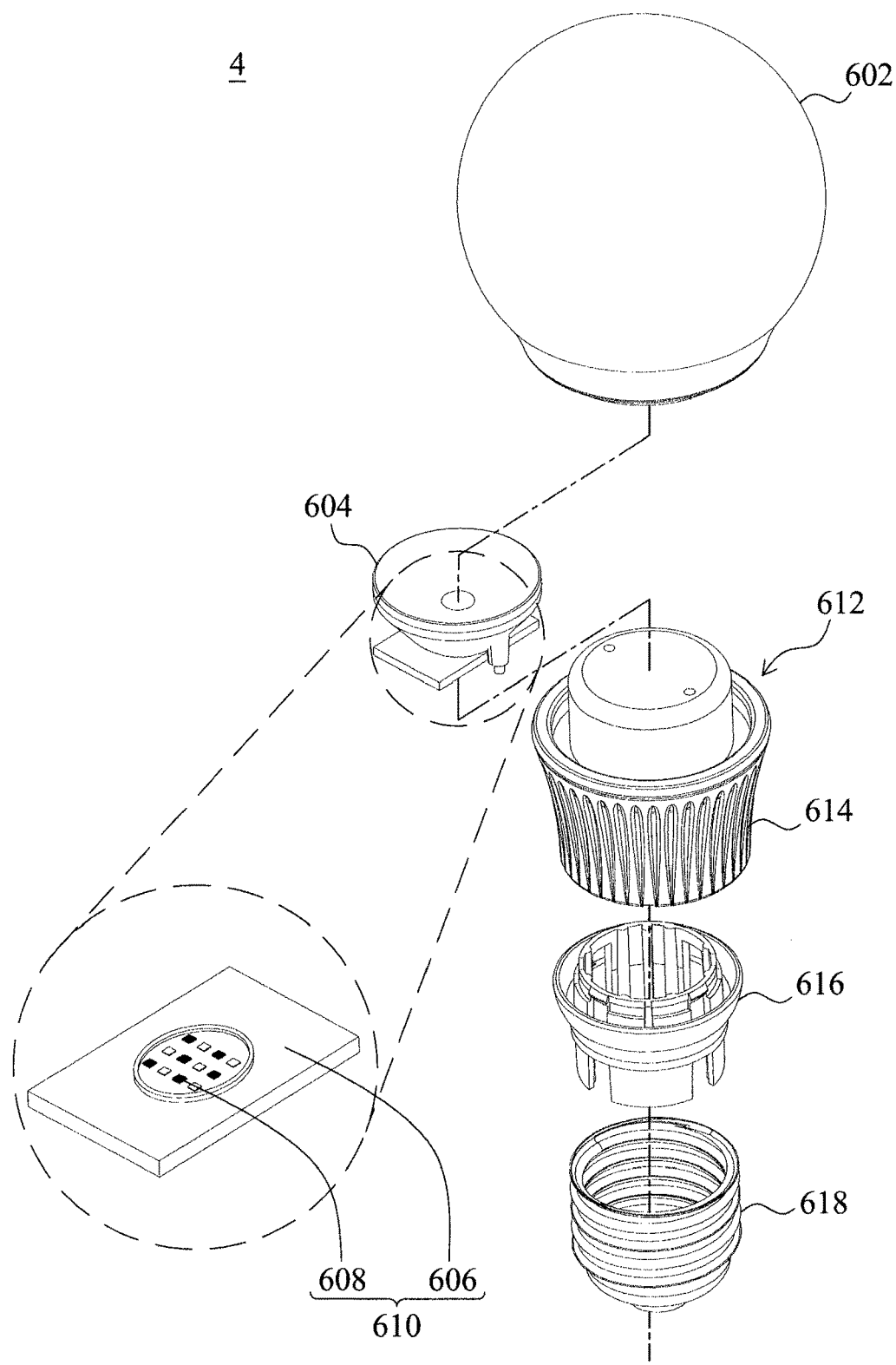
FIG. 12 illustrates a structure diagram of a light-emitting apparatus 4 in accordance with an embodiment of the present application.

FIG. 12 illustrates a structure diagram of a light-emitting apparatus 4 in accordance with an embodiment of the present application. The light-emitting apparatus 4 is a light bulb comprising an envelope 602, a lens 604, a light-emitting module 610, a base 612, a heat sink 614, a connector 616 and an electrical connecting device 618. The light-emitting module 610 comprises a submount 606 and a plurality of light-emitting devices 608 on the submount 606, wherein the plurality of light-emitting devices 608 can be the light-emitting 1 or 2 described in above embodiments.

The principle and the efficiency of the present application illustrated by the embodiments above are not the limitation of the application. Any person having ordinary skill in the art can modify or change the aforementioned embodiments.

Therefore, the protection range of the rights in the application will be listed as the following claims.

What is claimed is:

1. A light-emitting device, comprising:
   a semiconductor stack comprising a first semiconductor layer, a second semiconductor layer and an active layer between the first semiconductor layer and the second semiconductor layer;
   a first contact layer formed on the semiconductor stack and contact the first semiconductor layer;
   a second contact layer formed on the second semiconductor layer, wherein the second contact layer comprises multiple sidewalls and a size smaller than a size of the first contact layer, and the first contact layer is formed at the multiple sidewalls of the second contact layer;
   a first pad comprising a side formed on the first contact layer;
   a second pad formed on the semiconductor stack, wherein the second contact layer is between the second semiconductor layer and the second pad; and
   an insulating layer comprising a first portion covered by the first pad and a connecting portion adjacent to the side of the first pad, wherein the insulating layer comprises an opening between the first portion and the connecting portion to expose the first contact layer, the opening is constituted by a first side of the first portion and one side of the connecting portion, a distance smaller than 100 μm is between the side of the first pad and the first side of the first portion or between the side of the first pad and the one side of the connecting portion.

2. The light-emitting device of claim 1, wherein the distance is smaller than 50 μm.

3. The light-emitting device of claim 1, wherein the distance is smaller than 20 μm.

4. The light-emitting device of claim 1, wherein the opening of the insulating layer is formed along the side of the first pad.

5. The light-emitting device of claim 1, further comprising multiple vias penetrating the second semiconductor layer and the active layer to expose the first semiconductor layer, wherein the multiple vias are formed outside the first pad and the second pad in a top view of the light-emitting device.

6. The light-emitting device of claim 1, further comprising a pin region formed between the first pad and the second pad, wherein the pin region comprises a shape comprising rectangular, oval or circular.

7. The light-emitting device of claim 1, further comprising a pin region formed between the first pad and the second pad, wherein the pin region is covered by the insulating layer.

8. The light-emitting device of claim 1, further comprising a transparent conductive layer formed on the second semiconductor layer, a reflective layer formed on the transparent conductive layer, and a barrier layer formed on the reflective layer wherein the barrier layer comprises a metal material comprising titanium (Ti), tungsten (W), aluminum (Al), indium (In), tin (Sn), nickel (Ni), platinum (Pt), or an alloy of the above materials.

9. The light-emitting device of claim 8, wherein the material of the reflective layer and the barrier layer comprises a metal material other than gold (Au) or copper (Cu).

10. The light-emitting device of claim 8, wherein the barrier layer comprises titanium (Ti)/tungsten (W) on one side closer to the reflective layer and titanium (Ti)/aluminum (Al) on another side away from the reflective layer.

11. The light-emitting device of claim 8, wherein the reflective layer comprises a metal material comprising silver (Ag), aluminum (Al), rhodium (Rh), or an alloy of the above materials.

12. The light-emitting device of claim 8, wherein the second contact layer is formed on the barrier layer and separated from the first contact layer, and the first contact layer and the second contact layer comprise aluminum (Al) or platinum (Pt).

13. The light-emitting device of claim 1, further comprising a first insulating layer covering a sidewall of the active layer, and a second insulating layer comprising multiple openings exposing the first semiconductor layer and the second semiconductor layer.

14. The light-emitting device of claim 1, wherein the second pad contacts the second contact layer.

15. The light-emitting device of claim 14, wherein the second contact layer comprises a side contacting the second pad, and the side of the second contact layer comprises a metal material comprising titanium (Ti) or platinum (Pt).

16. The light-emitting device of claim 1, wherein the second contact layer is surrounded by the first contact layer from a top view of the light-emitting device.

17. The light-emitting device of claim 1, wherein the first contact layer comprises a side contacting the first semiconductor layer, and the side of the first contact layer comprises a metal material comprising chromium (Cr) or titanium (Ti).

18. The light-emitting device of claim 1, wherein the insulating layer comprises a second portion covered by the second pad and formed on the second contact layer.

19. The light-emitting device of claim 18, wherein the first portion, the second portion and the connecting portion of the insulating layer are separated from each other.

* * * * *